United States Patent
Nie et al.

(10) Patent No.: US 12,492,339 B2
(45) Date of Patent: Dec. 9, 2025

(54) QUANTUM DOT FILM, QUANTUM DOT LIGHT-EMITTING DIODE AND PREPARATION METHOD THEREOF

(71) Applicant: TCL TECHNOLOGY GROUP CORPORATION, Huizhou (CN)

(72) Inventors: Zhiwen Nie, Huizhou (CN); Wenyong Liu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 792 days.

(21) Appl. No.: 17/846,827

(22) Filed: Jun. 22, 2022

(65) Prior Publication Data
US 2022/0340812 A1 Oct. 27, 2022

Related U.S. Application Data

(63) Continuation of application No. PCT/CN2020/139114, filed on Dec. 24, 2020.

(30) Foreign Application Priority Data

Dec. 25, 2019 (CN) .......................... 201911353286.0

(51) Int. Cl.
| | |
|---|---|
| *C09K 11/88* | (2006.01) |
| *B82Y 20/00* | (2011.01) |
| *B82Y 40/00* | (2011.01) |
| *C09K 11/02* | (2006.01) |
| *H10K 50/115* | (2023.01) |
| *H10K 71/00* | (2023.01) |
| *H10K 77/00* | (2023.01) |

(52) U.S. Cl.
CPC .......... *C09K 11/883* (2013.01); *C09K 11/025* (2013.01); *H10K 77/00* (2023.02); *B82Y 20/00* (2013.01); *B82Y 40/00* (2013.01); *H10K 50/115* (2023.02); *H10K 71/00* (2023.02)

(58) Field of Classification Search
CPC .... C09K 11/025; H10K 50/115; H10K 50/80; H10K 71/00; H10K 77/00; H10K 94/00
See application file for complete search history.

(56) References Cited

U.S. PATENT DOCUMENTS

2016/0035919 A1 2/2016 Suh et al.

FOREIGN PATENT DOCUMENTS

| | | |
|---|---|---|
| CN | 106701060 A | 5/2017 |
| CN | 109256495 A | 1/2019 |
| CN | 109935710 A | 6/2019 |
| CN | 109935739 A | 6/2019 |

OTHER PUBLICATIONS

World Intellectual Property Organization (WIPO) International Search Report for PCT/CN2020/139114 Feb. 25, 2021 6 Pages (Including Translation).
Zhichun Li et al. "Highly luminescent and ultrastable CsPbBr3 perovskite quantum dots incorporated into a silica/alumina monolith." Angewandte Chemie 129.28 (2017); 8246-8250.
Weiwei Chen et al. "Surface-passivated cesium lead halide perovskite quantum dots: toward efficient light-emitting diodes with an inverted sandwich structure." Advanced Optical Materials 6.14 (2018): 1800007.

*Primary Examiner* — C Melissa Koslow
(74) *Attorney, Agent, or Firm* — ANOVA LAW GROUP, PLLC

(57) ABSTRACT

A quantum dot film includes: one surface grafted with a first ammonium halide ligand; and another surface opposite to the one surface and grafted with a second ammonium halide ligand. The first ammonium halide ligand has a general structural formula:

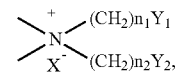

and the second ammonium halide ligand has a general structural formula:

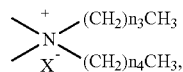

$n_1 \leq 12$, $n_2 \leq 12$, $12 \leq n_3 \leq 17$, $12 \leq n_4 \leq 17$, $n_1$, $n_2$, $n_3$ and $n_4$ are natural numbers, $Y_1$ and $Y_2$ are independently selected from phenyl or hydrogen, and X is halogen.

17 Claims, 2 Drawing Sheets

QUANTUM DOT FILM, QUANTUM DOT LIGHT-EMITTING DIODE AND PREPARATION METHOD THEREOF

CROSS-REFERENCE TO RELATED APPLICATION

This application is a continuation of International Application No. PCT/CN2020/139114, filed on Dec. 24, 2020, which claims priority of Chinese Patent Application CN201911353286.0, filed on Dec. 25, 2019, the entire contents of all of which are incorporated herein by reference.

TECHNICAL FIELD

The present disclosure relates to the technical field of light-emitting diode technology and, more particularly, to a quantum dot film, a quantum dot light-emitting diode, and a preparation method thereof.

BACKGROUND

The statements here only provide background information related to this application, and do not necessarily constitute prior art.

At present, the most fundamental reason restricting the development of QLED devices is that the injection of holes and electrons into a quantum dot light-emitting layer is not balanced, and the electrons and holes are not effectively recombined in the quantum dot light-emitting layer. This leads to recombination at the interface between the quantum dot light-emitting layer and a charge transfer layer adjacent to the quantum dot light-emitting layer (such as a hole transport layer or an electron transport layer) to emit light, and a luminous efficiency of the QLED devices is substantially reduced, especially for blue QLED devices with deeper HOMO levels. In addition, in order to drive the QLED devices to emit light, a high voltage needs to be applied, and the high voltage is likely to cause attenuation of light emission by quantum dots, and to even break down the quantum dot light-emitting layer.

In order to balance the recombination of quantum dot excitons in the quantum dot light-emitting layer, it is common to add an electron blocking layer including polymethyl methacrylate (PMMA) between the quantum dot light-emitting layer and the electron transport layer. Although the presence of PMMA can resist injection of a large number of electrons and facilitate the recombination of the electrons and holes in the quantum dot light-emitting layer, thereby improving the luminous efficiency and service life. However, the biggest drawback of this method is the requirement for accurate control of a thickness of the PMMA insulating material of the electron blocking layer. Too thin or too thick is not conducive to the recombination of the electrons and holes.

SUMMARY

One aspect of the present disclosure provides a quantum dot film. The quantum dot film includes: one surface grafted with a first ammonium halide ligand; and another surface opposite to the one surface and grafted with a second ammonium halide ligand. The first ammonium halide ligand has a general structural formula:

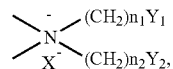

and the second ammonium halide ligand has a general structural formula:

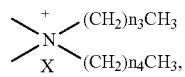

$n_1 \leq 12$, $n_2 \leq 12$, $12 \leq n_3 \leq 17$, $12 \leq n_4 \leq 17$, $n_1$, $n_2$, $n_3$ and $n_4$ are natural numbers, $Y_1$ and $Y_2$ are independently selected from phenyl or hydrogen, and X is halogen.

Another aspect of the present disclosure provides a quantum dot light-emitting diode. The quantum dot light-emitting diode includes: an anode; a cathode arranged opposite to the anode; and a quantum dot light-emitting layer disposed between the anode and the cathode. One surface of the quantum dot light-emitting layer close to the anode is grafted with a first ammonium halide ligand. Another surface of the quantum dot light-emitting layer close to the cathode is grafted with a second ammonium halide ligand. The first ammonium halide ligand has a general structural formula:

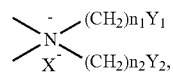

and the second ammonium halide ligand has a general structural formula:

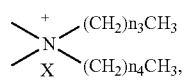

$n_1 \leq 12$, $n_2 \leq 12$, $12 \leq n_3 \leq 17$, $12 \leq n_4 \leq 17$, $n_1$, $n_2$, $n_3$ and $n_4$ are natural numbers, $Y_1$ and $Y_2$ are independently selected from phenyl or hydrogen, and X is halogen.

Another aspect of the present disclosure provides a method for forming a quantum dot light-emitting diode. The method includes: providing a substrate including a first electrode; and forming a quantum dot light-emitting layer on a side of the first electrode facing away from the substrate, where the quantum dot light-emitting layer includes quantum dots with a ligand grafted on a surface of the quantum dots, a first ligand is grafted on one surface of the quantum dot light-emitting layer close to the first electrode, and a second ligand is grafted on another surface opposite to the one surface of the quantum dot light-emitting layer. The first ligand has a general structural formula:

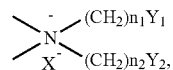

and the second ligand has a general structural formula:

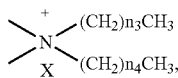

$n_1 \le 12$, $n_2 \le 12$, $12 \le n_3 \le 17$, $12 \le n_4 \le 17$, $n_1$, $n_2$, $n_3$ and $n_4$ are natural numbers, $Y_1$ and $Y_2$ are independently selected from phenyl or hydrogen, and X is halogen.

DETAILED DESCRIPTION OF THE EMBODIMENTS

Figure 1:
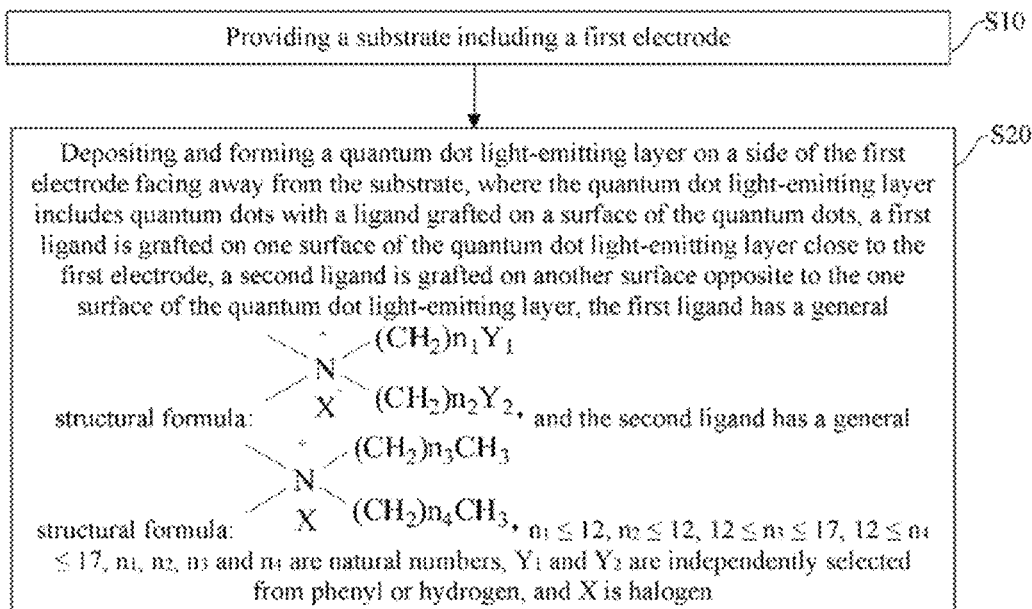
FIG. 1 is a flowchart of an exemplary method for fabricating a quantum dot light-emitting diode according to some embodiments of the present disclosure.

Embodiments of the present disclosure are described in detail below with reference to the accompanying drawings. It will be appreciated that the described embodiments are some rather than all of the embodiments of the present disclosure. Other embodiments obtained by those having ordinary skills in the art on the basis of the described embodiments without inventive efforts should fall within the scope of the present disclosure.

The present disclosure provides a quantum dot film. One surface of the quantum dot film is grafted with a first ammonium halide ligand, and the other surface of the quantum dot film that is opposite to the one surface grafted with the first ammonium halide ligand is grafted with a second ammonium halide ligand.

A general structural formula of the first ammonium halide ligand is

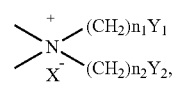

and a general structural formula of the second ammonium halide ligand is:

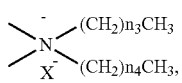

where, $n_1 \le 12$, $n_2 \le 12$, $12 \le n_3 \le 17$, $12 \le n_4 \le 17$, $n_1$, $n_2$, $n_3$ and $n_4$ are all natural numbers; $Y_1$ and $Y_2$ are independently selected from phenyl or hydrogen; and X is halogen.

The quantum dot film provided by the embodiments of the present disclosure has two opposite surfaces. The one surface is grafted with the first ammonium halide ligand, and the other surface of the quantum dot film that is opposite to the one surface grafted with the first ammonium halide ligand is grafted with the second ammonium halide ligand. Halide ions in the first and second ammonium halide ligands can bind to the cations in a defective state on the one surface of quantum dots, and ammonium cations can bind to the anions in a defect state on the one surface of the quantum dots. At the same time, a branch chain movement activity of this type of ligand is low, can significantly increase binding energy between a branch chain and quantum dot material, and provides a perfect coating of the surface of the quantum dots with the first and second ammonium halide ligands. Therefore, the two types of ammonium halide ligands are grafted firmly on the surface of the quantum dots and are unlikely to fall off, thereby improving dispersion and stability of the quantum dots, and at the same time improving the fluorescence efficiency of the quantum dots.

In addition, in the quantum dot film, on the one surface where the first ammonium halide ligand is grafted, two short branch chains of the first ammonium halide ligand can reduce a hole transport distance and significantly increase a carrier injection rate. And when the short branch chains include a benzene ring, because the benzene ring has a highly conjugated π bond, a hole transport rate can be significantly increased. On the other surface where the second ammonium halide ligand is grafted, two long branch chains of the second ammonium halide ligand can increase an electron transport distance, thereby slowing down electron transport to a certain extent. Therefore, through grafting different types of ammonium halide ligands on two different surfaces, the quantum dot film provided by the embodiments of the present disclosure improves an injection efficiency of the holes and electrons into the quantum dot light-emitting layer, balances the holes and electrons that are injected into the quantum dot light-emitting layer, and improves a recombination efficiency of the holes and electrons in the quantum dot light-emitting layer. Under the premise of not affecting optical performance of the quantum dots, not only the stability and dispersion of the quantum dots are substantially improved, but also recombination probability of carriers in the quantum dot light-emitting layer is improved.

In some embodiments, the ligands grafted to the quantum dots are all ammonium halide ligands. In this type of ammonium halide ligand, not only halide anions can effectively bind to the cations in the defective state on the one surface of the quantum dots, but also ammonium cations can be combined with the anions in the defective state on the one surface of the quantum dots, thereby proving the perfect coating on the one surface of the quantum dots, and substantially improving the fluorescence efficiency of the quantum dots. In addition, the branch chain movement activity of this type of ligand is low, which can significantly increase the binding energy between the branch chain and the quantum dot material, such that this type of ligand is unlikely to fall off from the one surface of the quantum dots, and the stability and dispersion of the quantum dots are improved. Thus, the stability and luminous efficiency of the quantum dot film are improved, and a photoelectric performance of the quantum dot light-emitting diode is improved.

In some embodiments, the structural formula of the first ammonium halide ligand grafted on the one surface of the quantum dot film is:

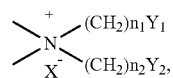

where, $n_1 \leq 12$, $n_2 \leq 12$, $n_1$ and $n_2$ are natural numbers; $Y_1$ and $Y_2$ are independently selected from phenyl or hydrogen; and X is halogen. The two branch chains of the first ammonium halide ligand are relatively short, which can reduce the hole transport distance and significantly increase the carrier injection rate. When $Y_1$ and $Y_2$ are all hydrogen, the short brunch chain ligand can reduce the hole transport distance and significantly increase the carrier injection rate. When the short branch chains include a benzene ring, the benzene ring has the highly conjugated π bond, which can significantly increase the hole transport rate.

In some embodiments, the structural formula of the second ammonium halide ligand grafted to the other surface of the quantum dot film is:

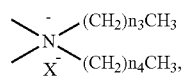

where, $12 \leq n_3 \leq 17$, $12 \leq n_4 \leq 17$, $n_3$ and $n_4$ are natural numbers; and X is a halogen. The two branch chains of the second ammonium halide ligand are relatively long, which can increase the electron transport distance, thereby slowing down the electron transport to a certain extent. Thus, the first ammonium halide ligand grafted on the one surface of the quantum dot film increases the hole transport rate, and the second ammonium halide ligand grafted on the other surface of the quantum dot film decreases the electron transport rate. The slowing down of the electron transport rate increases the probability of carrier recombination in the quantum dot light-emitting layer, reduces a driving voltage, and improves the efficiency and overall service life of a QLED device.

In some embodiments, the first ammonium halide ligand is grafted on the one surface of the quantum dot film near an anode side, and the second ammonium halide ligand is grafted on the other surface of the quantum dot film near a cathode side. In some embodiments, by setting the one surface of the quantum dot film on which the first ammonium halide ligand is grafted close to the anode, the first ammonium halide ligand can reduce the hole transport distance and significantly improve the carrier injection rate. The other surface of the quantum dot film grafted with the second ammonium halide ligand is placed close to the cathode. The second ammonium halide ligand can increase the electron transport distance, slow down the transport of electrons, balance the holes and electrons injected into the quantum dot light-emitting layer, and improve the recombination efficiency of the holes and electrons in the quantum dot light-emitting layer.

In some embodiments, the first ammonium halide ligand is selected from at least one of tetramethylammonium chloride, tetramethylammonium bromide, tetramethylammonium iodide, nonyl trimethyl ammonium bromide, dioctyl dimethyl ammonium chloride, dioctyl dimethyl ammonium bromide, didecyl dimethyl ammonium chloride, didecyl dimethyl ammonium bromide, benzalkonium bromide, benzalkonium chloride, dodecyl dimethyl benzyl ammonium bromide, dodecyl dimethyl benzyl ammonium chloride, phenyl trimethyl ammonium chloride, phenyl trimethyl ammonium bromide, phenyl triethyl ammonium chloride, phenyl triethyl ammonium bromide, or N-hexadecyl-N,N-dimethyl benzyl ammonium chloride. Any one or more of the above-described first ammonium halide ligands grafted on the one surface of the quantum dot film can improve the stability and dispersion of the quantum dots, and increase the fluorescence efficiency of the quantum dots, and reduce the hole transport distance. The short branch chains include benzene ring ligands. Because the benzene ring has the highly conjugated π bond, it can further increase the hole transport rate and significantly increase the carrier injection rate.

In some embodiments, the second ammonium halide ligand is selected from at least one of dioctadecyl dimethyl ammonium bromide, dioctadecyl dimethyl ammonium chloride, dihexadecyl dimethyl ammonium bromide, dihexadecyl dimethyl ammonium chloride, ditetradecyl dimethyl ammonium bromide, ditetradecyl dimethyl ammonium chloride, or didodecyl dimethyl ammonium bromide. The above-described second ammonium halide ligand grafted on the other side of the quantum dot film has two long branch chains, which can increase the electron transport distance, thereby slowing down the transport of electrons.

Correspondingly, the present disclosure also provides a quantum dot light-emitting diode. The quantum dot light-emitting diode includes an anode and a cathode disposed oppositely, and a quantum dot light-emitting layer disposed between the anode and the cathode. A first ammonium halide ligand is grafted on one surface of the quantum dot light-emitting layer close to the anode, and a second ammonium halide ligand is grafted on the other side of the quantum dot light-emitting layer close to the cathode.

The general structural formula of the first ammonium halide ligand is:

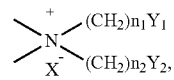

and the general structural formula of the second ammonium halide ligand is:

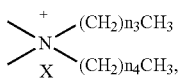

where, $n_1 \leq 12$, $n_2 \leq 12$, $12 \leq n_3 \leq 17$, $12 \leq n_4 \leq 17$, $n_1$, $n_2$, $n_3$ and $n_4$ are all natural numbers; $Y_1$ and $Y_2$ are independently selected from a benzene ring or hydrogen; and X is halogen.

The quantum dot light-emitting diode provided by the embodiments of the present disclosure includes the anode and the cathode disposed oppositely, and the quantum dot light-emitting layer disposed between the anode and the cathode. The first ammonium halide ligand is grafted on the one surface of the quantum dot light-emitting layer close to the anode, and the second ammonium halide ligand is grafted on the other surface of the quantum dot light-emitting layer close to the cathode. On one hand, the two short branch chains of the first ammonium halide ligand grafted on the one surface of the quantum dot light-emitting layer close to the anode can reduce the hole transport distance and significantly increase the carrier injection rate. When the two short brunch chains include a benzene ring, the benzene ring has the highly conjugated π bond, which can significantly increase the hole transport rate. On the other hand, the two long branch chains of the second ammonium halide ligand grafted on the surface of the quantum dot light-emitting layer close to the cathode can increase the electron transport distance, thereby slowing down the electron transport to a certain extent. Therefore, in the quantum dot light-emitting diode provided by the embodiments of the present disclosure, the recombination efficiency of the holes and electrons in the quantum dot light-emitting layer is high, and the driving voltage is reduced, thereby improving the efficiency and overall service life of the QLED devices.

In some embodiments, the quantum dot light-emitting layer of the quantum dot light-emitting diode is made of the above-described quantum dot film.

In some embodiments, the surface of the quantum dot light-emitting layer near the anode of the quantum dot light-emitting diode is grafted with the first ammonium halide ligand including at least one of tetramethylammonium chloride, tetramethylammonium bromide, tetramethylammonium iodide, nonyl trimethyl dimethyl ammonium bromide, dioctyl dimethyl ammonium chloride, dioctyl dimethyl ammonium bromide, didecyl dimethyl ammonium chloride, didecyl dimethyl ammonium bromide, benzalkonium bromide, benzalkonium chloride, dodecyl dimethyl benzyl ammonium bromide, dodecyl dimethyl benzyl chloride ammonium chloride, phenyl trimethyl ammonium chloride, phenyl trimethyl ammonium bromide, phenyl triethyl ammonium chloride, phenyl triethyl ammonium bromide, or N-hexadecyl-N,N-dimethyl benzyl ammonium chloride.

In some embodiments, the surface of the quantum dot light-emitting layer near the cathode of the quantum dot light-emitting diode is grafted with the second ammonium halide ligand including at least one of dioctadecyl dimethyl ammonium bromide, dioctadecyl dimethyl ammonium chloride, dihexadecyl dimethyl ammonium bromide, dihexadecyl dimethyl ammonium chloride, ditetradecyl dimethyl ammonium bromide, ditetradecyl dimethyl ammonium chloride, or didodecyl dimethyl ammonium bromide In some embodiment, the quantum dot light-emitting diode is divided into a positive type structure and an inverted type structure. The positive type structure includes a substrate/anode/quantum dot light-emitting layer/electron transport layer/cathode structure, a hole function layer such as a hole injection layer, a hole transport layer, and an electron blocking layer, which is optionally disposed between the anode and the quantum dot light-emitting layer, and an electron injection layer arbitrarily disposed between the electron transport layer and the cathode, and so on. The inverted type structure is opposite to the positive type structure.

For illustration purpose, the substrate may be a rigid or flexible substrate. The anode can be ITO, FTO or ZTO, with a thickness in the range of 30 nm to 150 nm. The hole injection layer can be PEODT: PSS, $WoO_3$, $MoO_3$, NiO, $V_2O_5$, HATCN, HATCN or CuS, etc., with a thickness in the range of 30 nm to 150 nm. The hole transport layer can be TFB, PVK, TCTA, TAPC, Poly-TBP, Poly-TPD, NPB, CBP, $MoO_3$, $WoO_3$, NiO, CuO, $V_2O_5$ or CuS, etc., with a thickness in the range of 30 nm to 180 nm. The first ammonium halide ligand is grafted on the one surface of the quantum dot light-emitting layer close to the anode, and the second ammonium halide ligand is grafted on the other surface close to the cathode. The quantum dot light-emitting layer includes at least one of the quantum dots including elements in IIB group and VIA group, the quantum dots including elements in IIIA group and VA group, or the quantum dots including elements in IVA group and VIA group. For example, the quantum dot light-emitting layer may include one of CdS, AlAs, or SnS. The electron transport layer may include one or more of ZnO, ZnMgO, ZnMgLiO, ZnInO, ZrO, $TiO_2$, Alq3, TAZ, TPBI, PBD, BCP, and Bphen, with a thickness in the range of 10 nm to 120 nm. The cathode may include Al, Ag, Au, Cu, Mo, or their alloys, with a thickness in the range of 80 nm to 120 nm.

The quantum dot light-emitting diode provided in the embodiments of the present disclosure can be prepared by the following method.

The present disclosure also provides a method for fabricating a quantum dot light-emitting diode. FIG. 1 is a flowchart of an exemplary method for fabricating a quantum dot light-emitting diode according to some embodiments of the present disclosure. As shown in FIG. 1, the method includes the following processes.

At S10, a substrate including a first electrode is provided.

At S20, a quantum dot light-emitting layer is deposited and formed on a side of the first electrode facing away from the substrate. The quantum dot light-emitting layer includes quantum dots with a ligand grafted on a surface of the quantum dots. A first ligand is grafted on one surface of the quantum dot light-emitting layer close to the first electrode. A second ligand is grafted on the other surface opposite to the one surface of the quantum dot light-emitting layer.

The first ligand and the second ligand are each selected from one of the following different general structural formulas:

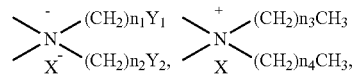

and the first ligand and the second ligand have different general structural formulas, where $n_1 \leq 12$, $n_2 \leq 12$, $12 \leq n_3 \leq 17$, $12 \leq n_4 \leq 17$, $n_1$, $n_2$, $n_3$ and $n_4$ are natural numbers; $Y_1$ and $Y_2$ are independently selected from phenyl or hydrogen; and X is halogen.

In some embodiments, after the substrate including the first electrode is provided, the quantum dot light-emitting layer is deposited on the side of the first electrode facing away from the substrate. The quantum dot light-emitting layer includes the quantum dots with a ligand grafted on the surface of the quantum dots. The one surface of the quantum dot light-emitting layer close to the first electrode includes the quantum dots grafted with a first ligand, and the other surface of the quantum dot light-emitting layer, which is opposite to the one surface, includes the quantum dots grafted with a second ligand. In some embodiments, the first ligand and the second ligand are selected from one of different general structural formulas, and the first ligand and the second ligand have different structural general formulas. In some embodiments, when the first ligand is

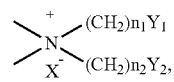

the second ligand is

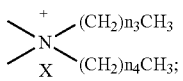

when the first ligand is

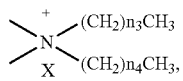

the second ligand is

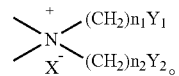

In some embodiments, the one surface of the light-emitting layer in the quantum dot light-emitting diode is grafted with

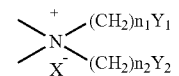

ligand. The ligand includes two short branch chains, which reduce the hole transport distance, and significantly increase the injection rate of carriers. When the two short branch chains include a benzene ring, because the benzene ring has a highly conjugated π bond, the hole transport rate can be significantly increased. The other surface is grafted with

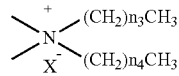

ligand. The ligand includes two long branch chains, which increase the electron transport distance, thereby slowing down the electron transport to a certain extent. Therefore, the electron and hole transport efficiency can be adjusted by the different ligands grafted on both sides of the quantum dot light-emitting layer, which can increase the probability of carrier recombination in the quantum dot light-emitting layer, reduce the driving voltage, and improve the efficiency and the service life of the QLED devices. In addition, the method of fabricating the quantum dot light-emitting diode provided by the embodiments of the present disclosure is simple to operate, widely adaptable, and easy to achieve industrialized production and application.

In some embodiments, when the first electrode is the anode, the first ligand is

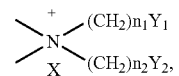

and the second ligand is

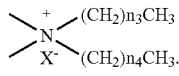

At this time, the one surface of the quantum dot light-emitting layer on which the first ligand is grafted can be directly deposited on the surface of the anode, or the hole function layer such as the hole injection layer, the hole transport layer, and the electron blocking layer can be arranged between the anode and the quantum dot light-emitting layer. The one surface of the quantum dot light-emitting layer on which the first ligand is grafted is deposited on the surface of the hole function layer.

In some embodiments, when the first electrode is the cathode, the first ligand is

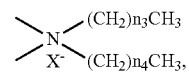

and the second ligand is

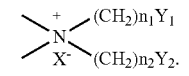

At this time, the one surface of the quantum dot light-emitting layer on which the first ligand is grafted can be directly deposited on the surface of the cathode, or the electron function layer such as the electron injection layer, the electron transport layer, and the hole blocking layer can be arranged between the cathode and the quantum dot light-emitting layer. The one surface of the quantum dot light-emitting layer grafted with the first ligand is deposited on the surface of the electron function layer.

Figure 2:
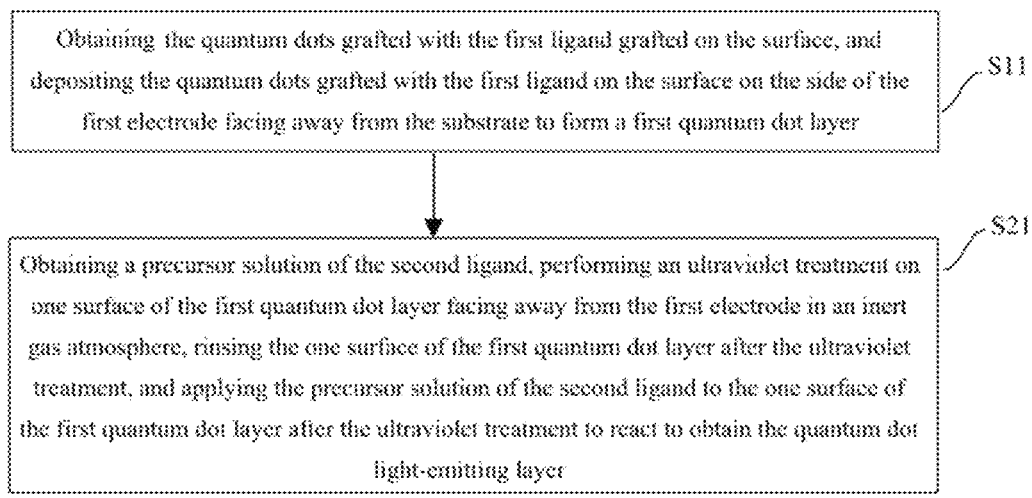
FIG. 2 is a flow chart of depositing and forming the quantum dot light-emitting layer on the side of the first electrode facing away from the substrate according to an embodiment of the present application.

In some embodiments, as shown in FIG. 2, depositing and forming the quantum dot light-emitting layer on the side of the first electrode facing away from the substrate includes the following processes.

At S11, quantum dots grafted with the first ligand grafted on the surface are obtained, and the quantum dots grafted with the first ligand grafted on the surface is deposited on the side of the first electrode facing away from the substrate to form a first quantum dot layer.

At S21, a precursor solution of the second ligand is obtained, an ultraviolet treatment is performed on the surface of the first quantum dot layer facing away from the first electrode in an inert gas atmosphere, the surface of the first quantum dot layer is rinsed after the ultraviolet treatment, and the precursor solution of the second ligand is added to the surface of the first quantum dot layer after the ultraviolet treatment to react to obtain the quantum dot light-emitting layer.

In some embodiments, depositing and forming the quantum dot light-emitting layer on the side of the first electrode facing away from the substrate includes: forming a first quantum dot layer on one side of the first electrode; in an inert gas atmosphere, performing an ultraviolet treatment on one surface of the first quantum dot layer facing away from the first electrode, the first ligand grafted on the one surface of the first quantum dot layer being desorbed by the energy of a specific ultraviolet wavelength; and after the shed ligand is washed and removed, applying a precursor solution of the second ligand to the one surface of the first quantum dot layer treated by the ultraviolet treatment to react, such that the one surface of the first quantum dot layer treated by the ultraviolet treatment is grafted with the second ligand to obtain the quantum dot light-emitting layer. Through the fabrication method, the one surface of the quantum dot light-emitting layer close to the anode is grafted with

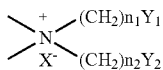

ligand, the other surface of the quantum dot light-emitting layer close to the cathode is grafted with

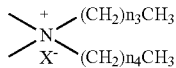

ligand.

In some embodiments, performing the ultraviolet treatment on the one surface of the first quantum dot layer facing away from the first electrode includes: placing the one surface of the first quantum dot layer facing away from the first electrode under the ultraviolet treatment with a wavelength in the range of 260 nm to 370 nm for 1 second to 60 minutes. In some embodiments, a temperature condition for applying the precursor solution of the second ligand to the one surface of the first quantum dot layer treated by the ultraviolet treatment is in the range of 40° C. to 120° C.

In some embodiments, the ultraviolet treatment is performed with a wavelength in the range of 260 nm to 370 nm in the inert gas atmosphere for at least 1 second, preferably 1 second to 60 minutes, and the ligand grafted on the one surface of the quantum dots is desorbed by the ultraviolet energy of the particular wavelength. Solvents such as alcohols, ethers, ketones, and nitrile are used to wash and remove the desorbed ammonium halide monomer, such that a large number of uncoordinated dangling bonds appear on the one surface of the quantum dots. These dangling bonds are more sensitive and the inert gas atmosphere effectively prevents oxidation and destruction of these dangling bonds by air, water, and oxygen.

At this time, different types of ligands are applied to the treated surface by dripping, spin coating, spraying or dipping, etc., and at a temperature in the range of 40° C. to 120° C., the ligands are combined with coordination vacancies on the quantum dot surface to be adsorbed on the surface of the quantum dots, such that the quantum dots on the treated surface is grafted with a large number of new ligands. In this way, different ligand types can be grafted on the surfaces of the quantum dot light-emitting layer close to the different device layers, and the stability and dispersion of the quantum dots are improved without affecting optical performance of the quantum dots. At the same time, the recombination probability of carriers in the quantum dot light-emitting layer is improved. the driving voltage is reduced, and the efficiency and overall service life of the QLED devices are improved.

Figure 3:
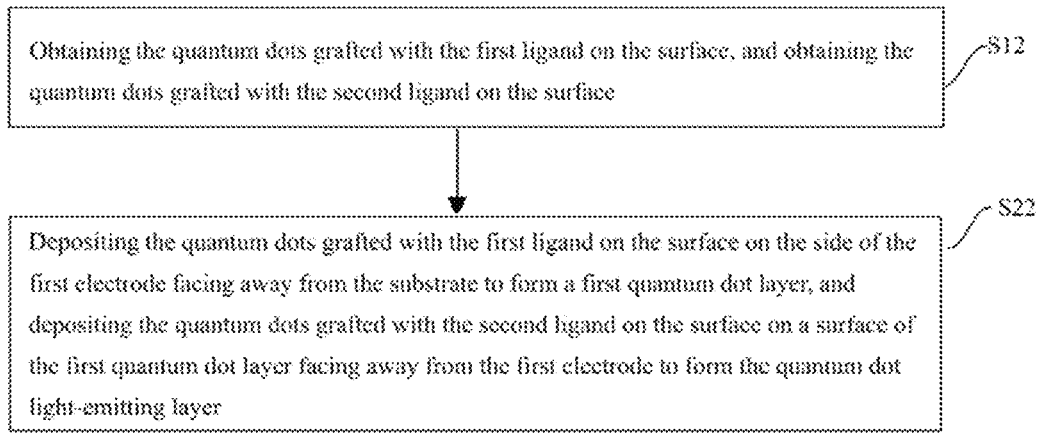
FIG. 3 is a flow chart of depositing and forming the quantum dot light-emitting layer on the side of the first electrode facing away from the substrate according to another embodiment of the present application.

In some embodiments, as shown in FIG. 3, depositing and forming the quantum dot light-emitting layer on the side of the first electrode facing away from the substrate includes the following processes.

At S12, quantum dots grafted with a first ligand on the surface are obtained, and quantum dots grafted with a second ligand on the surface are obtained.

At S22, the quantum dots with the first ligand grafted on the surface are deposited on the side of the first electrode facing away from the substrate to form a first quantum dot layer, and the quantum dots with the second ligand grafted on the surface are deposited on the surface of the first quantum dot layer facing away from the first electrode to obtain the quantum dot light-emitting layer.

In the embodiments of the present disclosure, depositing the quantum dot light-emitting layer on the surface of the first electrode facing away from the substrate includes: depositing the quantum dots grafted with the first ligand on the surface of the first electrode to form the first quantum dot layer, and depositing the quantum dots grafted with the second ligand on the other surface of the first quantum dot layer facing away from the first electrode, such that the surface of the quantum dot light-emitting layer close to the first electrode is grafted with the first ligand, and the opposite surface is grafted with the second ligand. As such, different surfaces of the light-emitting layer of the fabricated quantum dot light-emitting diode close to different electrodes are grafted with different ligands. The stability and dispersion of the quantum dots are improved without affecting the optical performance of the quantum dots. At the same time, the recombination probability of carriers in the quantum dot light-emitting layer is increased, the driving voltage is reduced, and the efficiency and overall service life of the QLED devices are improved.

In the embodiments of the present disclosure, a deposition thickness of the quantum dots grafted with the first ligand and a deposition thickness of the quantum dots grafted with the second ligand are not limited in the quantum dot light-emitting layer, as long as the recombination probability of carriers in the light-emitting layer is increased, the driving voltage is reduced, and the efficiency and overall service life of the QLED devices are improved. In some embodiments, the deposition thickness of the quantum dots grafted with the first ligand and the deposition thickness of the quantum dots grafted with the second ligand may each account for one-half of the thickness of the quantum dot light-emitting layer. In some embodiments, the quantum dot light-emitting layer may also be a mixed layer including a middle quantum dot layer grafted with a different ligand sandwiched between the quantum dot layer grafted with the first ligand and the quantum dot layer grafted with the second ligand each with a certain thickness on both sides, and the middle is grafted with different ligands.

Figure 4:
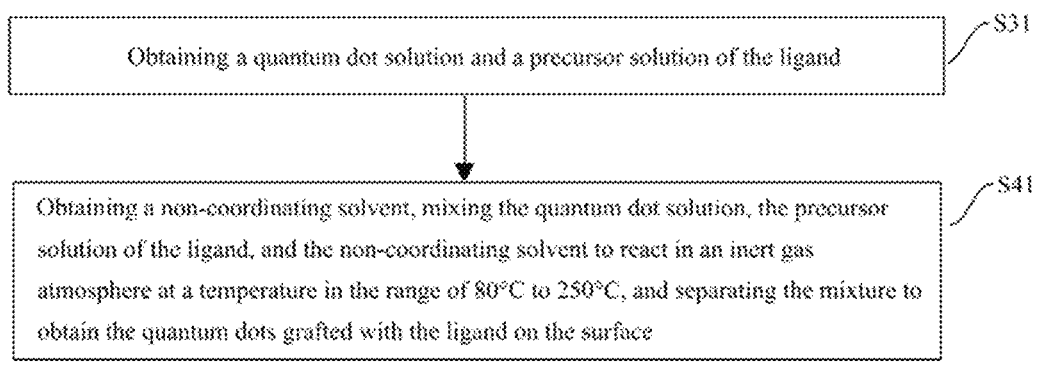
FIG. 4 is a flow chart of forming the quantum dots grafted with a ligand on the surface of the quantum dots according to an embodiment of the present application.

In some embodiments, as shown in FIG. 4, forming the quantum dots grafted with a ligand on the surface of the quantum dots includes the following processes.

At S31, the quantum dot solution and the precursor solution of the ligand are obtained.

At S41, a non-coordinating solvent is obtained, and the quantum dot solution, the precursor solution of the ligand, and the non-coordinating solvent are mixed to react in an inert gas atmosphere at a temperature in the range of 80° C. to 250° C., and are separated to obtain the quantum dots grafted with the ligand on the surface.

In some embodiments, in the method of obtaining the quantum dots grafted with the ligand on the surface, after the quantum dot solution, the precursor solution of the ligand, and the non-coordinating solvent are mixed to react in the inert gas atmosphere at the temperature in the range of 80° C. to 250° C. preferably for a time period in the range of 1 hour to 24 hours, the oil-soluble linear long-chain ligand originally grafted on the surface of the quantum dots is likely to fall off under the influence of the ambient temperature, thereby leaving a large number of cations in a defective state on the surface of the quantum dots. The halide ions in the ligand can effectively combine with the cations in the defective state on the surface of the quantum dots. At the same time, the ammonium cations in the ligand can combine with the anions in a defective state on the surface of the quantum dots, such that a large number of ligands can be grafted on the surface of the quantum dots, which can be separated to obtain the quantum dots grafted with the ligand on the surface thereof.

In some embodiments, both the quantum dots with the first ligand grafted on the surface and the quantum dots with the second ligand grafted on the surface can be formed by the above-described method.

Specifically, at S31, obtaining the quantum dot solution includes: dissolving the quantum dots in a solvent of at least one of chloroform, dichloroethane, dichloromethane, n-hexane, n-octane, chlorobenzene, acetonitrile, cyclohexane, toluene, benzene, xylene, or tetrahydrofuran, etc., to obtain the quantum dot solution. The solvents all have a good solubility for the quantum dots and can dissolve the quantum dots into a solution, which is beneficial to a rapid and thorough contact reaction between raw material components in a graft reaction system of the ligand and the quantum dots.

In some embodiments, a concentration of the quantum dot solution is 1 to 150 mg/ml. In some embodiments, the quantum dots are formulated into a solution with a concentration in the range of 1 to 150 mg/ml. The solution is added to the reaction system to facilitate the reaction between the quantum dots and the ligand. The quantum dot solution with this concentration is beneficial to an interactive contact reaction between the raw materials in the reaction system. If the concentration of the quantum dot solution is too low or too high, it is not conducive to the exchange of the ligand on the quantum dot surface in the reaction system, thereby affecting the modification effect of the quantum dot surface.

In some embodiments, the solvent in the quantum dot solution is selected from at least one of: chloroform, dichloroethane, dichloromethane, n-hexane, n-octane, chlorobenzene, acetonitrile, cyclohexane, toluene, benzene, xylene, or tetrahydrofuran. The concentration of the quantum dot solution is 1 to 150 mg/ml.

Specifically, at S31, obtaining the precursor solution of the first ligand or the second ligand includes: dissolving the first ligand or the second ligand in at least one solvent such as chloroform, dichloroethane, and dichloromethane. In some embodiments, the first ligand or the second ligand is dissolved in at least one solvent such as chloroform, dichloroethane, dichloromethane and the like under the condition of heating and refluxing at a certain temperature. In some embodiments, the ligand is pre-dissolved and prepared into a solution, and the solution is added to the reaction system. The fully dissolved and dispersed ligand can quickly contact and react with the quantum dots in the reaction system, thereby improving the reaction effect and facilitating to replacement of the ligand on the surface of the quantum dots.

Specifically, at S41, the non-coordinating solvent is obtained, and after the quantum dot solution, the precursor solution of the ligand, and the non-coordinating solvent are mixed, the reaction is carried out for 1 to 24 hours in the inert gas atmosphere at the temperature in the range of 80° C. to 250° C. The quantum dots with the first ligand or the second ligand grafted on the surface are obtained by separation. In some embodiments, after mixing the quantum dot solution, the precursor solution of the ligand, and the non-coordinating solvent, the reaction is carried out in the inert gas atmosphere at the temperature in the range of 80° C. to 250° C., preferably for 1 to 24 hours, to obtain the quantum dots grafted with the ligand on the surface. The ambient temperature promotes the desorption of an original ligand on the surface of the quantum dots, thereby facilitating the adsorption of the ligand to the surface of the quantum dots. The inert gas atmosphere protects and prevents metal elements in the quantum dots from being destroyed by oxidation. The reaction time ensures that surface ligand replacement is fully carried out.

In some embodiments, in the reaction system where the quantum dot solution, the precursor solution of the ligand, and the non-coordinating solvent are mixed, a mass ratio of the ligand to the quantum dots is in the range of (0.1-10):1. The mass ratio effectively provides a material basis to ensure the replacement of the oil-soluble ligand originally grafted on the surface of the quantum dots by the ligand in the reaction system, thereby maximizing exchange of the oil-soluble ligand originally grafted on the surface of the quantum dots to the ligand. If the mass ratio of the ligand to the quantum dots in the reaction system is too low, the ligand cannot fully modify the surface of the quantum dots. In some embodiments, the mass ratio may be 0.5:1, 1:1, 2:1, 5:1, 8:1, or 10:1.

In some embodiments, a volume ratio of a total volume of the quantum dot solution and the precursor solution of the ligand to a volume of the non-coordinating solvent is in the range of 1: (1-50). The non-polar solvent in the quantum dot solution and the precursor solution of the ligand in the reaction system has a low boiling point, and is heated and volatilized during a high-temperature reaction. The solvent environment in the reaction system is mainly provided by a non-coordinating solvent. The volume ratio of the total volume of the quantum dot solution and the ligand precursor solution to the volume of the non-coordinating solvent is in the range of 1: (1~50), which not only ensures the solvent environment in the reaction system, but also ensures suitable reaction concentration of the quantum dots and the ligand. If the volume ratio is too small, there will be too little non-coordinating solvent in the high-temperature reaction system, which is not conducive to a dynamic desorption and adsorption process of the ligands on the quantum dot surface. In some embodiments, the volume ratio may be 1:10, 1:20, 1:30, 1:40, or 1:50.

In some embodiments, the non-coordinating solvent is selected from at least one of olefins, alkanes, ether hydrocarbons, or aromatic compounds. The use of at least one of olefins, alkanes, ether hydrocarbons, or aromatic compounds as the non-coordinating solvent provides a desired solvent environment for the ligand to replace the oil-soluble ligand originally grafted on the surface of the quantum dots, thereby facilitating the dynamic desorption and adsorption of the ligands on the surface of the quantum dots.

In some embodiments, in the reaction system where the quantum dot solution, the precursor solution of the ligand, and the non-coordinating solvent are mixed, the mass ratio of the ligand to the quantum dots is in the range of (0.1~10):1, the volume ratio of the total volume of the quantum dot solution and the precursor solution of the ligand to the volume of the non-coordinating solvent is in the range of 1:(1~50), and the non-coordinating solvent is selected from at least one of olefins, alkanes, ether hydrocarbons, or aromatic compounds.

Example 1

A quantum dot light-emitting diode (QLED) includes a quantum dot light-emitting layer grafted with the first ligand of benzyl trimethyl ammonium bromide on the surface close to the hole transport layer and grafted with the second ligand of dioctadecyl dimethyl ammonium bromide on the surface close to the electron transport layer. The quantum dot light-emitting diode can be formed by the following processes.

(1) The quantum dots with the first ligand of benzyl trimethyl ammonium bromide grafted on the surface are formed.

① At room temperature, 50 mg of benzyl trimethyl ammonium bromide is mixed with 20 ml of chloroform. The mixture is reflux heated to 50° C. until completely dissolved to obtain the first ligand solution of benzyl trimethyl ammonium bromide.

② Under the condition of the argon gas atmosphere and ambient temperature of 150° C., the above-described first ligand solution of benzyl trimethyl ammonium bromide and 50 ml of octadecene are added to a quantum dot n-hexane solution (CdSe/CdS, surface ligand oleic acid and trioctyl phosphine oxide) with a volume of 10 ml and a concentration of 30 mg/ml. The mixture is reacted for 10 min and is separated. n-hexane and ethanol are used in a repeated process of dissolution, precipitation and centrifugation to obtain the quantum dots with benzyl trimethyl bromide ammonium 1 ligand grafted on the surface.

(2) The quantum dot light-emitting layer is formed.

③ At room temperature, 50 mg of dioctadecyl dimethyl ammonium bromide is mixed with 20 ml of chloroform, and the mixture is reflux heated to 50° C. until completely dissolved to obtain the second ligand solution of dioctadecyl dimethyl ammonium bromide.

④ The quantum dots grafted with benzyl trimethyl ammonium bromide 1 ligand is deposited on the hole transport layer to form the quantum dot light-emitting layer. In the argon atmosphere, the surface of the quantum dot light-emitting layer facing away from the hole transport layer is treated under a 365 nm ultraviolet light for 10 minutes. Isopropanol is used to remove the first ligand of benzyl trimethyl ammonium bromide desorbed on the surface of the quantum dots. The second ligand solution of dioctadecyl dimethyl ammonium bromide is dripped to the surface of the quantum dot light-emitting layer for an ultraviolet desorption treatment in the argon atmosphere at the temperature of 100° C. Ethanol is used to rinse off the residual second ligand of dioctadecyl dimethyl ammonium bromide to obtain the quantum dot light-emitting layer with the second ligand of dioctadecyl dimethyl ammonium bromide grafted on the surface facing away from the hole transport layer.

(3) The QLED devices are formed by the following processes

A bottom electrode, a hole injection layer, a hole transport layer, a quantum dot light emitting layer, an electron transport layer and a top electrode are sequentially formed on a substrate to obtain a quantum dot light emitting diode. The substrate is a glass substrate. The bottom electrode is ITO with a thickness of 100 nm. The hole injection layer is PEDOT: PSS with a thickness of 40 nm. The hole transport layer is TFB with a thickness of 100 nm. The quantum dot light-emitting layer is formed as described above. The quantum dot light-emitting layer is grafted with the first ligand of benzyl trimethyl ammonium bromide on the surface close to the hole transport layer, and is grafted with the second ligand of dioctadecyl dimethyl ammonium bromide on the surface close to the electron transport layer, with a thickness of 100 nm. The electron transport layer is ZnO with a thickness of 80 nm. The top electrode is Al with a thickness of 50 nm.

Example 2

Another quantum dot light-emitting diode is formed by the processes similar to that of Example 1 with the following differences. The surface of the quantum dots in the quantum dot light-emitting layer close to the hole transport layer is grafted with the first ligand of nonyl trimethyl ammonium bromide, and the surface of the quantum dots in the quantum dot light-emitting layer close to the electron transport layer is grafted with the second ligand of dioctadecyl dimethyl ammonium bromide.

Example 3

Another quantum dot light-emitting diode is formed by the processes similar to that of Example 1 with the following differences. The surface of the quantum dots in the quantum dot light-emitting layer close to the hole transport layer is grafted with the first ligand of nonyl trimethyl ammonium bromide, and the surface of the quantum dots in the quantum dot light-emitting layer close to the electron transport layer is grafted with the second ligand of dihexadecyl dimethyl ammonium bromide.

Example 4

Another quantum dot light-emitting diode is formed by the processes similar to that of Example 1 with the following differences. The surface of the quantum dots in the quantum dot light-emitting layer close to the hole transport layer is grafted with the first ligand of benzyl trimethyl ammonium bromide, and the surface of the quantum dots in the quantum dot light-emitting layer close to the electron transport layer is grafted with the second ligand of dihexadecyl dimethyl ammonium bromide.

Comparative Example 1

Another quantum dot light-emitting diode is formed by the processes similar to that of Example 1 with the following differences. The quantum dot light-emitting layer only includes the first ligand and does not undergo the second ligand improvement treatment in step ④.

Comparative Example 2

Another quantum dot light-emitting diode is formed by the processes similar to that of Example 2 with the following differences. The quantum dot light-emitting layer only includes the first ligand and does not undergo the second ligand improvement treatment in step ④.

Comparative Example 3

Another quantum dot light-emitting diode is formed by the processes similar to that of Example 3 with the following differences. The quantum dot light-emitting layer only includes the first ligand and does not undergo the second ligand improvement treatment in step ④.

Comparative Example 4

Another quantum dot light-emitting diode is formed by the processes similar to that of Example 4 with the following differences. The quantum dot light-emitting layer only includes the first ligand and does not undergo the second ligand improvement treatment in step ④.

In order to verify the advancement of the quantum dot light-emitting diodes provided in examples 1 to 4 and comparative examples 1 to 4 of the present disclosure, an experimental test is conducted on the external quantum efficiency of the quantum dot light-emitting diodes formed by each of the examples 1~4 and comparative examples 1-4. The test results are shown in Table 1 below:

TABLE 1

| Test item/test object | Comp. example 1 | Example 1 | Comp. example 2 | Example 2 | Comp. example 3 | Example 3 | Comp. example 4 | Example 4 |
|---|---|---|---|---|---|---|---|---|
| $EQE_{max}$ (%) | 10 | 17 | 9 | 15 | 11 | 16 | 8 | 15 |

It can be seen from the above test results that the external quantum efficiency (EQE max) of the quantum dot light-emitting diodes formed by the processes in Examples 1 to 4 is significantly higher than the external quantum efficiency of the quantum dot light-emitting diodes formed by the processes in comparative examples 1 to 4, which indicates that the different types of ammonium halide ligands grafted on both surfaces effectively improve the injection efficiency of the holes and electrons into the quantum dot light-emitting layer, balance the holes and electrons injected into the quantum dot light-emitting layer, and increase the recombination efficiency of the holes and electrons in the quantum dot light-emitting layer.

The quantum dot film provided by the embodiments of the present disclosure provides the following beneficial effects. The quantum dot film has two opposite surfaces. The one surface of the quantum dot film is grafted with the first ammonium halide ligand, and the other surface opposite to the one surface of the quantum dot film is grafted with the second ammonium halide ligand. The halide ions in the two types of ammonium halide ligands can bind to the cations in the defective state on the surface of the quantum dots, and the ammonium cations can bind to the anions in the defective state on the surface of the quantum dot. At the same time, the branch chain movement activity of this type of ligand is low, can significantly increase the binding energy between the branch chain and the quantum dot material, and provides the perfect coating of the surface of the quantum dots with the first and second ammonium halide ligands. Therefore, the two types of ammonium halide ligands are grafted firmly on the surface of the quantum dots and are unlikely to fall off, thereby improving the dispersion and stability of the quantum dot, and at the same time improving the fluorescence efficiency of the quantum dots.

In addition, in the quantum dot film, on the one surface where the first ammonium halide ligand is grafted, the two short branch chains of the first ammonium halide ligand can reduce the hole transport distance and significantly increase the carrier injection rate. And when the short branch chains include the benzene ring, because the benzene ring has the highly conjugated π bond, the hole transport rate can be significantly increased. On the other surface where the second ammonium halide ligand is grafted, the two long branch chains of the second ammonium halide ligand can increase the electron transport distance, thereby slowing down the electron transport to a certain extent. Therefore, through grafting different types of ammonium halide ligands on the two different surfaces, the quantum dot film provided by the embodiments of the present disclosure improves the injection efficiency of the holes and electrons into the quantum dot light-emitting layer, balances the holes and electrons that are injected into the quantum dot light-emitting layer, and improves the recombination efficiency of the holes and electrons in the quantum dot light-emitting layer. Under the premise of not affecting the optical performance of the quantum dots, not only the stability and dispersion of quantum dots are significantly improved, but also the recombination probability of carriers in the quantum dot light-emitting layer is improved.

The above-mentioned embodiments are only used to illustrate the technical solutions of the present disclosure, not to limit them. Although the present disclosure has been described in detail with reference to the foregoing embodiments, those of ordinary skill in the art should understand that the foregoing technical solutions described in the embodiments can be modified, or some of the technical features can be equivalently replaced. These modifications or replacements do not cause the essence of the corresponding technical solutions to deviate from the spirit and scope of the technical solutions of the embodiments of the present disclosure, and should be included in the scope of the present disclosure.

The invention claimed is:

1. A quantum dot film, comprising:
one surface grafted with a first ammonium halide ligand; and
another surface opposite to the one surface and grafted with a second ammonium halide ligand;
wherein the first ammonium halide ligand has a general structural formula:

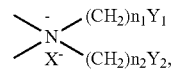

and the second ammonium halide ligand has a general structural formula:

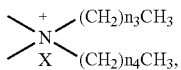

$n_1 \leq 12$, $n_2 \leq 12$, $12 \leq n_3 \leq 17$, $12 \leq n_4 \leq 17$, $n_1$, $n_2$, $n_3$ and $n_4$ are natural numbers, $Y_1$ and $Y_2$ are independently selected from phenyl or hydrogen, and X is halogen.

2. The quantum dot film according to claim 1, wherein:
the first ammonium halide ligand is selected from at least one of tetramethylammonium chloride, tetramethylammonium bromide, tetramethylammonium iodide, nonyl trimethyl ammonium bromide, dioctyl dimethyl ammonium chloride, dioctyl dimethyl ammonium bromide, didecyl dimethyl ammonium chloride, didecyl dimethyl ammonium bromide, benzalkonium bromide, benzalkonium chloride, dodecyl dimethyl benzyl ammonium bromide, dodecyl dimethyl benzyl ammonium chloride, phenyl trimethyl ammonium chloride, phenyl trimethyl ammonium bromide, phenyl triethyl ammonium chloride, phenyl triethyl ammonium bromide, or N-hexadecyl-N,N-dimethyl benzyl ammonium chloride.

3. The quantum dot film according to claim 1, wherein:
the second ammonium halide ligand is selected from at least one of dioctadecyl dimethyl ammonium bromide, dioctadecyl dimethyl ammonium chloride, dihexadecyl dimethyl ammonium bromide, dihexadecyl dimethyl ammonium chloride, ditetradecyl dimethyl ammonium bromide, ditetradecyl dimethyl ammonium chloride, or didodecyl dimethyl ammonium bromide.

4. A quantum dot light-emitting diode, comprising:
an anode;
a cathode arranged opposite to the anode; and
the quantum dot film according to claim 1 as a quantum dot light-emitting layer and disposed between the anode and the cathode;
wherein:
one surface of the quantum dot light-emitting layer close to the anode is grafted with the first ammonium halide ligand; and
another surface of the quantum dot light-emitting layer close to the cathode is grafted with the second ammonium halide ligand.

5. The quantum dot light-emitting diode according to claim 4, wherein:
the first ammonium halide ligand is selected from at least one of tetramethylammonium chloride, tetramethylammonium bromide, tetramethylammonium iodide, nonyl trimethyl ammonium bromide, dioctyl dimethyl ammonium chloride, dioctyl dimethyl ammonium bromide, didecyl dimethyl ammonium chloride, didecyl dimethyl ammonium bromide, benzalkonium bromide, benzalkonium chloride, dodecyl dimethyl benzyl ammonium bromide, dodecyl dimethyl benzyl ammonium chloride, phenyl trimethyl ammonium chloride, phenyl trimethyl ammonium bromide, phenyl triethyl ammonium chloride, phenyl triethyl ammonium bromide, or N-hexadecyl-N,N-dimethyl benzyl ammonium chloride.

6. The quantum dot light-emitting diode according to claim 4, wherein:
the second ammonium halide ligand is selected from at least one of dioctadecyl dimethyl ammonium bromide, dioctadecyl dimethyl ammonium chloride, dihexadecyl dimethyl ammonium bromide, dihexadecyl dimethyl ammonium chloride, ditetradecyl dimethyl ammonium bromide, ditetradecyl dimethyl ammonium chloride, or didodecyl dimethyl ammonium bromide.

7. A method for forming a quantum dot light-emitting diode, comprising:
providing a substrate comprising a first electrode; and
forming a quantum dot light-emitting layer on a side of the first electrode facing away from the substrate, wherein the quantum dot light-emitting layer includes quantum dots with a ligand grafted on a surface of the quantum dots, a first ligand is grafted on one surface of the quantum dot light-emitting layer close to the first electrode, and a second ligand is grafted on the another surface opposite to the one surface of the quantum dot light-emitting layer; and
forming a second electrode having a charge opposite of that of the first electrode on a formed quantum dot light-emitting layer;

wherein the first ligand has a general structural formula;

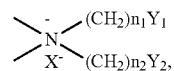

and the second ligand has a general structural formula:

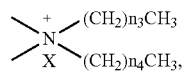

$n_1 \leq 12$, $n_2 \leq 12$, $12 \leq n_3 \leq 17$, $12 \leq n_4 \leq 17$, $n_1$, $n_2$, $n_3$ and $n_4$ are natural numbers, $Y_1$ and $Y_2$ are independently selected from phenyl or hydrogen, and X is halogen;
wherein forming the quantum dot light-emitting layer on the side of the first electrode facing away from the substrate comprises:
obtaining the quantum dots grafted with the first ligand grafted on the surface, and depositing the quantum dots grafted with the first ligand on the surface on the side of the first electrode facing away from the substrate to form a first quantum dot layer; and
obtaining a precursor solution of the second ligand, performing an ultraviolet treatment on one surface of the first quantum dot layer facing away from the first electrode in an inert gas atmosphere, rinsing the one surface of the first quantum dot layer after the ultraviolet treatment, and applying the precursor solution of the second ligand to the one surface of the first quantum dot layer after the ultraviolet treatment to react to obtain the quantum dot light-emitting layer.

8. The method for forming the quantum dot light-emitting diode according to claim 7, wherein performing the ultraviolet treatment on the surface of the first quantum dot layer facing away from the first electrode includes:
placing the one surface of the first quantum dot layer facing away from the first electrode under the ultraviolet treatment with a wavelength in the range of 260 nm to 370 nm for 1 second to 60 minutes; or
applying the precursor solution of the second ligand to the one surface of the first quantum dot layer treated by the ultraviolet treatment at a temperature in the range of 40° C. to 120° C.

9. The method for fabricating the quantum dot light-emitting diode according to claim 7, wherein:
when the first electrode is an anode, the first ligand has a general structural formula:

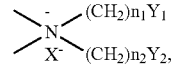

and the second ligand has the general structural formula:

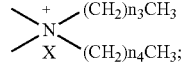

and when the first electrode is a cathode, the second ligand has the general structural formula:

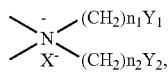

and the first ligand has the general structural formula:

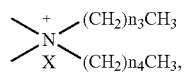

wherein $n_1 \leq 12$, $n_2 \leq 12$, $12 \leq n_3 \leq 17$, $12 \leq n_4 \leq 17$, $n_1$, $n_2$, $n_3$ and $n_4$ are natural numbers, $Y_1$ and $Y_2$ are independently selected from phenyl or hydrogen, and X is halogen.

10. The method for forming the quantum dot light-emitting diode according to claim 7, wherein forming the quantum dots grafted with the ligand on the surface of the quantum dots includes:
obtaining a quantum dot solution and a precursor solution of the ligand; and
obtaining a non-coordinating solvent, mixing the quantum dot solution, the precursor solution of the ligand, and the non-coordinating solvent to react in an inert gas atmosphere at a temperature in the range of 80° C. to 250° C., and separating the mixture to obtain the quantum dots grafted with the ligand on the surface.

11. The method for forming the quantum dot light-emitting diode according to claim 10, when mixing the quantum dot solution, the precursor solution of the ligand, and the non-coordinating solvent, further comprising:
mixing the quantum dot solution, the precursor solution of the ligand, and the non-coordinating solvent according to a mass ratio of the ligand to the quantum dots in a range of (0.1~10):1; or
mixing the quantum dot solution, the precursor solution of the ligand, and the non-coordinating solvent according to a volume ratio of a total volume of the quantum dot solution and the precursor solution of the ligand to a volume of the non-coordinating solvent in a range of 1:(1~50).

12. The method for forming the quantum dot light-emitting diode according to claim 11, wherein:
the non-coordinating solvent is selected from at least one of olefins, alkanes, ether hydrocarbons, or aromatic compounds; or
a solvent in the quantum dot solution is selected from at least one of chloroform, dichloroethane, dichloromethane, n-hexane, n-octane, chlorobenzene, acetonitrile, cyclohexane, toluene, benzene, xylene, or tetrahydrofuran; or
a solvent in the precursor solution of the ligand is selected from at least one of: chloroform, dichloroethane, or dichloromethane.

13. A method for forming a quantum dot light-emitting diode, comprising:
providing a substrate comprising a first electrode; and
forming a quantum dot light-emitting layer on a side of the first electrode facing away from the substrate, wherein the quantum dot light-emitting layer includes quantum dots with a ligand grafted on a surface of the quantum dots, a first ligand is grafted on one surface of the quantum dot light-emitting layer close to the first electrode, and a second ligand is grafted on the another surface opposite to the one surface of the quantum dot light-emitting layer; and
forming a second electrode having a charge opposite of that of the first electrode on a formed quantum dot light-emitting layer;
wherein the first ammonium halide ligand has a general structural formula:

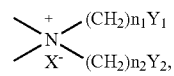

and the second ammonium halide ligand has a general structural formula:

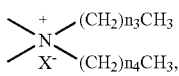

$n_1 \leq 12$, $n_2 \leq 12$, $12 \leq n_3 \leq 17$, $12 < n_4 \leq 17$, $n_1$, $n_2$, $n_3$ and $n_4$ are natural numbers, $Y_1$ and $Y_2$ are independently selected from phenyl or hydrogen, and X is halogen;
wherein depositing the quantum dot light-emitting layer on the side of the first electrode facing away from the substrate includes:
obtaining the quantum dots grafted with the first ligand on the surface, and obtaining the quantum dots grafted with the second ligand on the surface; and
depositing the quantum dots grafted with the first ligand on the surface on the side of the first electrode facing away from the substrate to form a first quantum dot layer, and depositing the quantum dots grafted with the second ligand on the surface on a surface of the first quantum dot layer facing away from the first electrode to form the quantum dot light-emitting layer.

14. The method for fabricating the quantum dot light-emitting diode according to claim 13, wherein:
when the first electrode is an anode, the first ligand has a general structural formula:

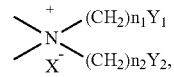

and the second ligand has the general structural formula:

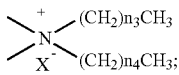

and
when the first electrode is a cathode, the second ligand has the general structural formula:

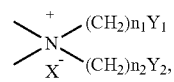

and the first ligand has the general structural formula:

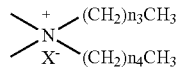

wherein $n_1 \leq 12$, $n_2 \leq 12$, $12 \leq n_3 \leq 17$, $12 < n_4 \leq 17$, $n_1$, $n_2$, $n_3$ and $n_4$ are natural numbers, $Y_1$ and $Y_2$ are independently selected from phenyl or hydrogen, and X is halogen.

15. The method for forming the quantum dot light-emitting diode according to claim 13, wherein forming the quantum dots grafted with the ligand on the surface of the quantum dots includes:
   obtaining a quantum dot solution and a precursor solution of the ligand; and
   obtaining a non-coordinating solvent, mixing the quantum dot solution, the precursor solution of the ligand, and the non-coordinating solvent to react in an inert gas atmosphere at a temperature in the range of 80° C. to 250° C., and separating the mixture to obtain the quantum dots grafted with the ligand on the surface.

16. The method for forming the quantum dot light-emitting diode according to claim 15, when mixing the quantum dot solution, the precursor solution of the ligand, and the noncoordinating solvent, further comprising:
   mixing the quantum dot solution, the precursor solution of the ligand, and the noncoordinating solvent according to a mass ratio of the ligand to the quantum dots in a range of (0.1~10):1; or
   mixing the quantum dot solution, the precursor solution of the ligand, and the noncoordinating solvent according to a volume ratio of a total volume of the quantum dot solution and the precursor solution of the ligand to a volume of the non-coordinating solvent in a range of 1:(1~50).

17. The method for forming the quantum dot light-emitting diode according to claim 16, wherein:
   the non-coordinating solvent is selected from at least one of olefins, alkanes, ether hydrocarbons, or aromatic compounds; or
   a solvent in the quantum dot solution is selected from at least one of chloroform, dichloroethane, dichloromethane, n-hexane, n-octane, chlorobenzene, acetonitrile, cyclohexane, toluene, benzene, xylene, or tetrahydrofuran; or
   a solvent in the precursor solution of the ligand is selected from at least one of: chloroform, dichloroethane, or dichloromethane.

* * * * *